US011731239B2

(12) United States Patent
Fukushi

(10) Patent No.: US 11,731,239 B2
(45) Date of Patent: Aug. 22, 2023

(54) PROCESSING APPARATUS

(71) Applicant: DISCO CORPORATION, Tokyo (JP)

(72) Inventor: Nobuyuki Fukushi, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 270 days.

(21) Appl. No.: 17/169,864

(22) Filed: Feb. 8, 2021

(65) Prior Publication Data

US 2021/0260721 A1  Aug. 26, 2021

(30) Foreign Application Priority Data

Feb. 21, 2020 (JP) ................. 2020-028113

(51) Int. Cl.
| | |
|---|---|
| *B24B 51/00* | (2006.01) |
| *H01L 21/67* | (2006.01) |
| *B24B 7/22* | (2006.01) |
| *H01L 21/677* | (2006.01) |
| *H01L 21/687* | (2006.01) |

(52) U.S. Cl.
CPC .............. *B24B 51/00* (2013.01); *B24B 7/228* (2013.01); *H01L 21/67051* (2013.01); *H01L 21/67766* (2013.01); *H01L 21/67769* (2013.01); *H01L 21/68707* (2013.01)

(58) Field of Classification Search
CPC ......... H01L 21/67766; H01L 21/67769; H01L 21/68707; H01L 21/68714; H01L 21/67778; H01L 21/67028; H01L 21/67034; H01L 21/67051; B24B 51/00; B24B 37/34; B24B 37/345; B24B 27/0069; B24B 7/228

USPC ............................................................ 451/5
See application file for complete search history.

(56) References Cited

U.S. PATENT DOCUMENTS

2019/0351525 A1* 11/2019 Fukushi ................. B24B 49/00
2022/0410343 A1* 12/2022 Ishibashi .................. B08B 3/02

FOREIGN PATENT DOCUMENTS

| JP | 2018122421 A | | 8/2018 |
|---|---|---|---|
| JP | 2020123617 A | * | 8/2020 |

OTHER PUBLICATIONS

JP-2020123617-A translation (Year: 2020).*
Search report issued in counterpart Singapore patent application No. 10202101077T, dated Jan. 20, 2022.

* cited by examiner

*Primary Examiner* — Joel D Crandall
*Assistant Examiner* — Abbie E Quann
(74) *Attorney, Agent, or Firm* — Greer, Burns & Crain, Ltd.

(57) ABSTRACT

A processing apparatus includes: a selection section that selects two or more components from a plurality of components including a holding table, a processing unit, a robot, a temporary placing unit, a carrying-in mechanism, a cleaning unit, and a carrying-out mechanism; and a control unit that handles a workpiece at part of routes that correspond to the components selected by the selection section, of the routes for passage of the workpiece at the time of processing the workpiece full-automatically by use of the plurality of components.

5 Claims, 5 Drawing Sheets

PROCESSING APPARATUS

BACKGROUND OF THE INVENTION

Field of the Invention

The present invention relates to a processing apparatus.

Description of the Related Art

As disclosed in Japanese Patent Laid-open No. 2018-122421, a processing apparatus for processing a workpiece full-automatically includes, for example, at least: a chuck tale that holds the workpiece; a processing unit that processes the workpiece by use of a processing tool; a carrying-in mechanism that carries the workpiece onto the chuck table; a cassette stage on which to place a cassette accommodating the workpieces in a shelf form; a cleaning unit for cleaning the workpiece; a carrying-out mechanism for carrying the workpiece held by the chuck table to the cleaning unit; and a touch panel used for inputting processing conditions of the processing apparatus and displaying processing state.

In such a processing apparatus, upon the start of a full-automatic operation, the workpiece is taken out of the cassette by a robot, and is carried to the chuck table by a carrying-in mechanism. The workpiece held by the chuck table is processed by the processing unit. Thereafter, the workpiece is carried to the cleaning unit by the carrying-out mechanism, is cleaned by the cleaning unit, and is accommodated in the cassette by the robot.

SUMMARY OF THE INVENTION

Incidentally, when the workpiece is processed based on processing conditions which are used for the first time, there is a demand for quickly confirming the results of processing. In addition, when carrying pads of the carrying-in mechanism and the carrying-out mechanism or a robot hand of the robot is replaced, there is a demand for quickly confirming whether or not the workpiece can be carried normally.

When a series of full-automatic operations are carried out, however, it takes time to confirm the results of processing or the status of carrying.

Accordingly, it is an object of the present invention to provide a processing apparatus with which an operation of part of a full-automatic operation and the results of the partial operation can be confirmed quickly.

In accordance with an aspect of the present invention, there is provided a processing apparatus for processing a workpiece full-automatically. The processing apparatus includes a holding table that holds the workpiece, a processing unit that processes the workpiece by use of a processing tool, a cassette stage on which to place a shelf-type cassette for accommodating a plurality of workpieces, a robot that takes out the workpiece from the cassette or accommodates the workpiece into the cassette, a temporary placing unit for temporarily placing the workpiece taken out of the cassette, a carrying-in mechanism that carries the workpiece temporarily placed on the temporary placing unit onto the holding table, a cleaning unit that cleans the workpiece, a carrying-out mechanism that carries the workpiece held by the holding table to the cleaning unit, a selection section that selects two or more components from a plurality of components including the holding table, the processing unit, the robot, the temporary placing unit, the carrying-in mechanism, the cleaning unit, and the carrying-out mechanism, and a control unit that handles the workpiece at part of routes that correspond to the components selected by the selection section, of the routes for passage of the workpiece at a time of processing the workpiece full-automatically by use of the plurality of components.

Preferably, the processing apparatus further includes a touch panel that displays a layout drawing depicting a layout, as viewed from above, of the plurality of components by a plurality of illustrations each corresponding to the plurality of components, in which the selection section selects the components corresponding to the illustrations touched in the layout drawing displayed on the touch panel.

In the processing apparatus according to one aspect of the present invention, only those partial processes (handlings) of processes (handlings) to be applied to a workpiece which concerns to components selected by the operator can be carried out. In other words, only the processes (handlings) to be confirmed can be carried out, so that the time for confirmation by the operator can be shortened.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

An embodiment of the present invention will be described in detail below referring to the attached drawings. A processing apparatus 1 illustrated in FIG. 1 includes a rough grinding unit 30 and a finish grinding unit 31, and a wafer 100 held on either chuck table 5 is ground by the rough grinding unit 30 and the finish grinding unit 31.

Figure 1:
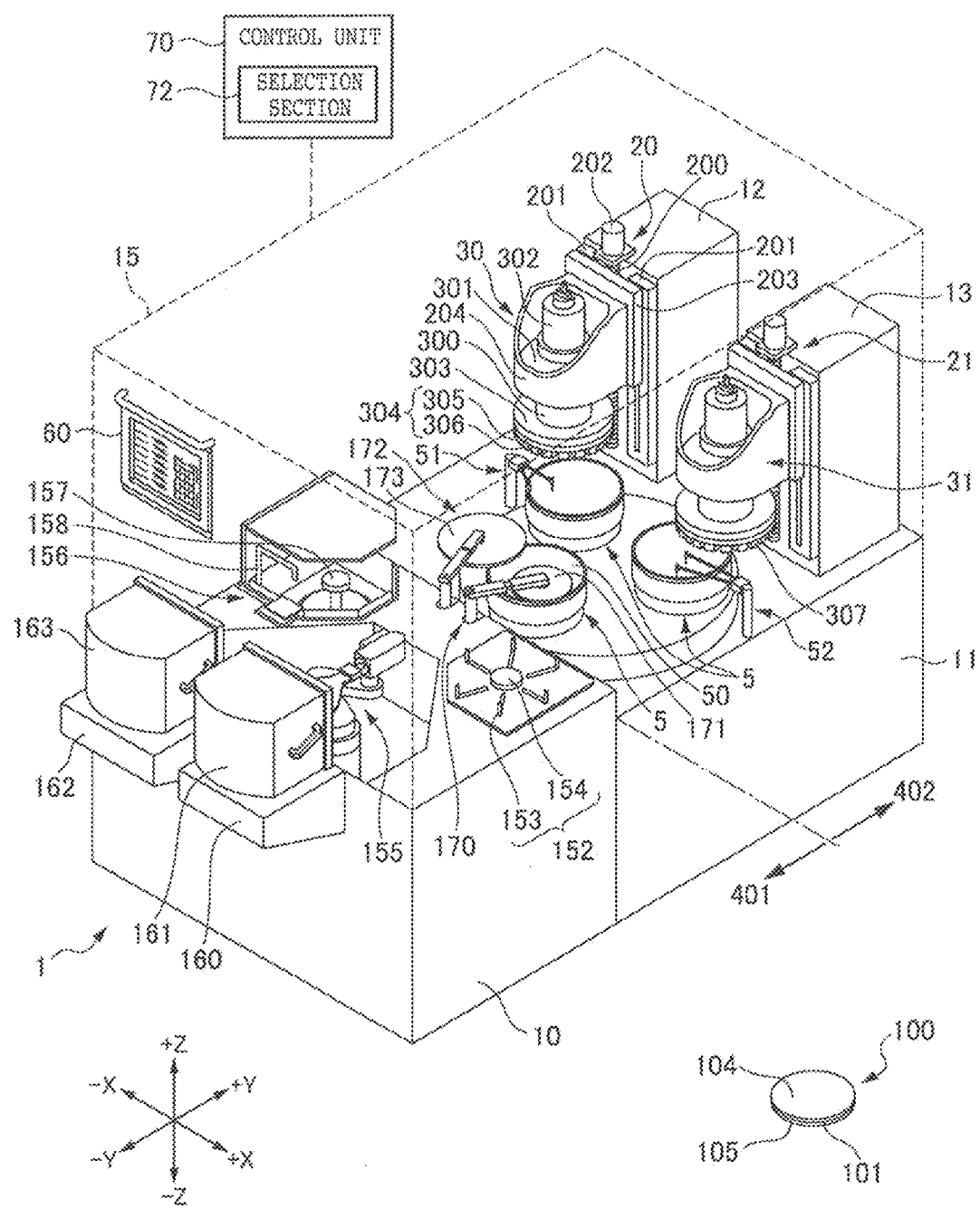
FIG. 1 is a perspective view depicting the configuration of a processing apparatus.

The wafer 100 depicted in FIG. 1 is an example of workpiece, and is, for example, a circular semiconductor wafer. Devices (not illustrated) are formed on a front surface 101 of the wafer 100. The front surface 101 of the wafer 100 is directed to the lower side in FIG. 1, and is protected by a protective tape 105 attached thereto. A back surface 104 of the wafer 100 is a work surface subjected to grinding.

The processing apparatus 1 has a first apparatus base 10 and a second apparatus base 11 disposed on the rear side (+Y direction side) of the first apparatus base 10. The upper side of the first apparatus base 10 is a carrying-in/out region 401 which is a region where carrying-in/out of the wafer 100 or the like is conducted. The upper side of the second apparatus base 11 is a processing region 402. In the processing region 402, the wafer 100 held by the chuck table 5 is processed by the rough grinding unit 30 or the finish grinding unit 31.

A first cassette stage 160 and a second cassette stage 162 are provided on the front surface side (−Y direction side) of the first apparatus base 10. A first cassette (unload cassette) 161 in which to accommodate the wafers 100 before processing is mounted on the first cassette stage 160. A second cassette (load cassette) 163 in which to accommodate the wafers 100 after processing is mounted on the second cassette stage 162.

The first cassette 161 and the second cassette 163 include a plurality of shelves in the inside thereof, and one of the wafers 100 is accommodated on each of the shelves. In other words, the first cassette 161 and the second cassette 163 are configured in a shelf form for accommodating a plurality of the wafers 100.

Openings (not illustrated) of the first cassette 161 and the second cassette 163 are directed to the +Y direction side. A robot 155 is disposed on the +Y direction side of these openings. The robot 155 includes a holding surface for holding the wafer 100. The robot 155 carries (accommodate) the wafer 100 after processing into the second cassette 163. In addition, the robot 155 takes out the wafer 100 before processing from the first cassette 161 and places the wafer 100 on a temporary placing table 154 of a temporary placing unit 152.

The temporary placing unit 152 is used for temporarily placing the wafer 100 taken out of the first cassette 161, and is provided at a position adjacent to the robot 155. The temporary placing unit 152 has the temporary placing table 154 and an aligning mechanism 153. The aligning mechanism 153 includes a plurality of aligning pins disposed on the outside such as to surround the temporary placing table 154, and sliders that move the aligning pins in radial directions of the temporary placing table 154. With the aligning pins moved radially toward the center of the temporary placing table 164, the circle connecting the plurality of aligning pins is reduced in diameter, and the wafer 100 placed on the temporary placing table 154 with the back surface 104 on the upper side is aligned (centered) to a predetermined position.

A carrying-in mechanism 170 is provided at a position adjacent to the temporary placing unit 152. The carrying-in mechanism 170 carries the wafer 100 temporarily placed on the temporary placing unit 152 onto the chuck table 5. The carrying-in mechanism 170 includes a suction pad (carrying pad) 171 having a suction surface for suction-holding the back surface 104 of the wafer 100. The carrying-in mechanism 170 suction-holds the wafer 100 temporarily placed on the temporary placing table 154 by the suction pad 171, carries the wafer 100 to the chuck table 5 located in the vicinity of the temporary placing unit 152 in the processing region 402, and places the wafer 100 on a holding surface 50 of the chuck table 5.

The chuck table 5 is an example of a holding table for holding the wafer 100, and includes the holding surface 50 for suction-holding the wafer 100. The holding surface 50 communicates with a suction source (not illustrated), and can suction-hold the wafer 100 through the protective tape 105. The chuck table 5, in a state of suction-holding the wafer 100 by the holding surface 50, can be rotated around a central axis passing through the center of the holding surface 50 and extending in the Z axis direction.

In the present embodiment, three chuck tables 5 are disposed on a turntable 6 disposed on the second apparatus base 11, at regular intervals on a circle centered on the center of the turntable 6. A rotational shaft (not illustrated) for rotation of the turntable 6 is disposed at the center of the turntable 6. The turntable 6 can be rotated with an axis extending in the Z axis direction as a center, by the rotational shaft. With the turntable 6 rotated, the three chuck tables 5 are revolved. This enables the chuck tables 5 to be sequentially positioned at a position in the vicinity of the temporary placing unit 152, a position on a lower side of the rough grinding unit 30, and a position on a lower side of the finish grinding unit 31.

A first column 12 is erected on the rear side (+Y direction side) on the second apparatus base 11. The rough grinding unit 30 for rough grinding of the wafer 100 and a rough grinding feeding mechanism 20 for grinding feeding of the rough grinding unit 30 are disposed on a front surface of the first column 12. The rough grinding unit 30 is an example of processing unit for processing the wafer 100 by use of a processing tool.

The rough grinding feeding mechanism 20 includes a pair of guide rails 201 parallel to the Z axis direction, a lift table 203 sliding on the guide rails 201, a ball screw 200 parallel to the guide rails 201, a motor 202 for rotationally driving the ball screw 200, and a holder 204 attached to a front surface of the lift table 203. The holder 204 holds the rough grinding unit 30.

The lift table 203 is disposed slidably on the guide rails 201. A nut section (not illustrated) is fixed to a back surface side of the lift table 203. The nut section is in screw engagement of the ball screw 200. The motor 202 is connected to one end portion of the ball screw 200.

In the rough grinding feeding mechanism 20, with the motor 202 rotating the ball screw 200, the lift table 203 is moved in the Z axis direction along the guide rails 201. As a result, the holder 204 attached to the lift table 203 and the rough grinding unit 30 held on the holder 204 are also moved in the Z axis direction together with the lift table 203. In this way, the rough grinding feeding mechanism 20 performs grinding feeding of the rough grinding unit 30 along the Z axis direction.

The rough grinding unit 30 includes a spindle housing 301 fixed to the holder 204, a spindle 300 rotatably held by the spindle housing 301, a motor 302 that rotationally drives the spindle 300, a wheel mount 303 attached to a lower end of the spindle 300, and a grinding wheel 304 detachably connected to a lower surface of the wheel mount 303.

The spindle housing 301 is held by the holder 204 such as to extend in the Z axis direction. The spindle 300 extends in the Z axis direction such as to be orthogonal to the holding surface 50 of the chuck table 5, and is rotatably supported by the spindle housing 301.

The motor 302 is connected to the upper end side of the spindle 300. The spindle 300 is rotated with a rotational axis extending in the Z axis direction as a center by the motor 302.

The wheel mount 303 is formed in a disk-like shape, is fixed to a lower end (tip end) of the spindle 300, and is rotated according to the rotation of the spindle 300. The wheel mount 303 supports the grinding wheel 304.

The grinding wheel 304 is formed to have a diameter substantially the same as that of the wheel mount 303. The grinding wheel 304 includes an annular wheel base (annular base) 305 formed of a metallic material such as an aluminum alloy. A plurality of rough grindstones 306 of a substantially rectangular parallelepiped shape are disposed and fixed on a lower surface of the wheel base 305 along the whole circumference. The rough grindstones 306 are rotated by the rotation of the spindle 300 to grind the back surface 104 of the wafer 100 held by the chuck table 5. The rough grindstones 306 are an example of a processing tool and are grindstone containing comparatively large abrasive grains.

The spindle 300 is formed therein with a grinding water channel extending in the Z axis direction, and a grinding water supply source communicates with the grinding water channel (both not illustrated). Grinding water supplied from the grinding water supply source to the spindle 300 is jetted from an opening at a lower end of the grinding water channel downward toward the rough grindstones 306, to reach the part of contact between the rough grindstones 306 and the wafer 100.

A first height gauge 51 is disposed at a position adjacent to the chuck table 5 disposed on a lower side of the rough grinding unit 30. The first height gauge 51 measures the thickness of the wafer 100 on a contact basis or a non-contact basis during rough grinding, for example.

In addition, on the rear side on the second apparatus base 11, a second column 13 is erected such as to be adjacent to the first column 12 along the X axis direction. A finish grinding unit 31 for finish grinding of the wafer 100 and a finish grinding feeding mechanism 21 for grinding feeding of the finish grinding unit 31 are disposed on a front surface of the second column 13. The finish grinding unit 31 is an example of processing unit for processing the wafer 100 by use of a processing tool.

The finish grinding feeding mechanism 21 has a configuration similar to that of the rough grinding feeding mechanism 20, and can perform grinding feeding of the finish grinding unit 31 along the Z axis direction. The finish grinding unit 31 has a configuration similar to that of the rough grinding unit 30, except for including a finish grindstones 307 in place of the rough grindstones 306. The finish grindstones 307 are an example of a processing tool and are grindstones containing comparatively small abrasive grains.

A second height gauge 52 is disposed at a position adjacent to the chuck table 5 disposed on a lower side of the finish grinding unit 31. The second height gauge 52 measures the thickness of the wafer 100 on a contact basis or a non-contact basis during finish grinding, for example.

The wafer 100 after finish grinding is carried out by a carrying-out mechanism 172. The carrying-out mechanism 172 carries the wafer 100 held by the chuck table 5 to the cleaning unit 156.

The carrying-out mechanism 172 includes a suction pad (carrying pad) 173 having a suction surface for suction-holding the back surface 104 of the wafer 100. The carrying-out mechanism 172 suction-holds the back surface 104 of the wafer 100 after finish grinding that is placed on the chuck table 5 by the suction pad 173. Thereafter, the carrying-out mechanism 172 carries out the wafer 100 from the chuck table 5, and carries the wafer 100 to a spinner table 157 of a sheet fed type cleaning unit 156.

The cleaning unit 156 is a spinner cleaning unit for cleaning the wafer 100. The cleaning unit 156 includes a spinner table 157 for holding the wafer 100 and a nozzle 158 for jetting cleaning water and dry air toward the spinner table 157.

In the cleaning unit 156, the spinner table 157 holding the wafer 100 is rotated, and cleaning water is jetted toward the back surface 104 of the wafer 100, whereby spinner cleaning of the back surface 104 is performed. Thereafter, dry air is blown to the wafer 100, to dry the wafer 100.

The wafer 100 cleaned by the cleaning unit 156 is carried into the second cassette 163 on the second cassette stage 162 by the robot 155.

In addition, the processing apparatus 1 includes a housing 15 that covers the first apparatus base 10 and the second apparatus base 11. A touch panel 60 is disposed on a side surface of the housing 15. Various kinds of information such as processing conditions concerning the processing apparatus 1 is displayed on the touch panel 60. Besides, the touch panel 60 is used also for setting various kinds of information such as processing conditions. Thus, the touch panel 60 functions as an input device for inputting information and functions also as a display device for displaying information.

In addition, the processing apparatus 1 has a control unit 70 therein. The control unit 70 includes a central processing unit (CPU) that performs arithmetic processing according to a control program, a storage medium such as a memory, and the like. The control unit 70 performs various kinds of processing (handling), and integrally controls each of the components of the processing apparatus 1. Besides, the control unit 70 includes a selection section 72.

An operation of the processing apparatus 1 will be described below, together with the functions of the control unit 70 and the selection section 72.

In the processing apparatus 1 according to the present embodiment, the wafer 100 can be processed full-automatically by use of the aforementioned plurality of components (members).

In other words, the control unit 70 can perform full-automatically: taking-out of the wafer 100 from the first cassette 161 and carrying-in of the wafer 100 to the temporary placing unit 152 by use of the robot 155; carrying-in of the wafer 100 onto the chuck table 5 by use of the carrying-in mechanism 170; grinding of the wafer 100 by use of the rough grinding unit 30 and the finish grinding unit 31; carrying-in of the wafer 100 to the cleaning unit 156 by use of the carrying-out mechanism 172; cleaning of the wafer 100 by use of the cleaning unit 156; and accommodation of the wafer 100 after cleaning into the second cassette 163 by use of the robot 155.

Besides, in the processing apparatus 1, only a part of processes (handlings) by the aforementioned components can be selectively performed according to the operator's demand. In other words, the wafer 100 can be processed (handled) by only a part of routes that correspond to the selected components, of the routes for passage of the wafer 100 at a time of processing the wafer 100 full-automatically by use of the plurality of components.

Figure 2:
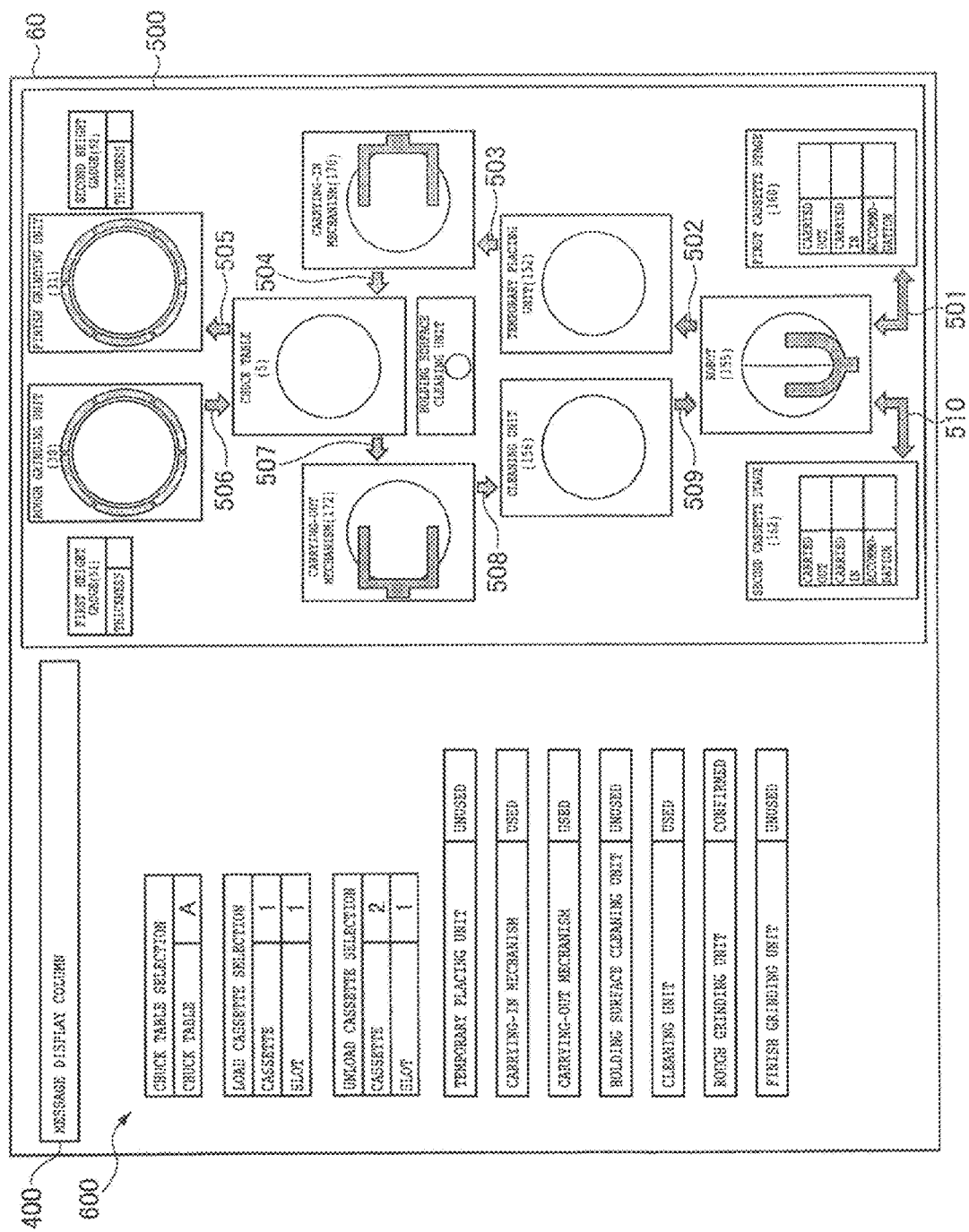
FIG. 2 is a diagram depicting a display example of a touch panel.

As depicted in FIG. 2, a message display column 400 for displaying messages to the operator and an apparatus state display column 600 for indicating the state (apparatus state) of the processing apparatus 1 set are indicated on the left side of the touch panel 60 of the processing apparatus 1.

The kind of the chuck table 5 to be used, the selected cassette (1 or 2) and slots (1 to 25) in the first cassette (unload cassette) 161, and the selected cassette (1 or 2) and slots (1 to 25) in the second cassette (load cassette) 163 are indicated in the apparatus state display column 600.

In addition, use status (used or unused) of the temporary placing unit 152, the carrying-in mechanism 170, the carrying-out mechanism 172, a holding surface cleaning unit, and the cleaning unit 156 and status (used, unused, or confirmed) of the rough grinding unit 30 and the finish grinding unit 31 are indicated in the apparatus state display column 600. The holding surface cleaning unit is for cleaning the holding surface 50 of the chuck table 5.

Besides, a layout drawing 500 including illustrations of the components is displayed on the right side of the touch panel 60. The layout drawing 500 is a drawing including illustrations of the components, for indicating the layout, as viewed from above, of the components of the processing apparatus 1.

Note that, in the layout drawing 500 depicted in FIG. 2, the illustration of each component is accompanied by the name of each component, and the reference symbol indicated in FIG. 1 is given in a parenthesized form.

In addition, in the layout drawing 500, information concerning the wafer 100 (the number of wafers carried out, the number of wafers carried in, and the number of wafers accommodated) in the first cassette 161 on the first cassette stage 160 and the second cassette 163 on the second cassette stage 162 is indicated. Further, the results of measurement of the thickness of the wafer 100 by the first height gauge 51 and the second height gauge 52 may also be indicated.

Besides, in the layout drawing 500, arrows 501 to 510 are indicated between the illustrations of the components. These arrows 501 to 510 correspond to routes (partial routes) constituting parts of all the routes (processing routes) concerning processing of the wafer 100 that connect the components. For example, the arrow 501 corresponds to a partial route from the first cassette stage 160 (first cassette 161) to the robot 155, namely, a partial route concerning take-out (unloading) of the wafer 100 by the robot 155.

In the present embodiment, the operator touches the illustrations of at least two components in the layout drawing 500 displayed on the touch panel 60. In response to this, the selection section 72 of the control unit 70 selects at least two components corresponding to the touched illustrations.

Further, the control unit 70 clearly indicates, by use of the layout drawing 500, the at least two selected components and the routes (partial routes) of part of the processing routes passing through these components. In addition, the control unit 70 processes (handles) the wafer 100 in the partial routes concerning the selected components by use of the selected components according to the operator's instruction.

Figure 3:
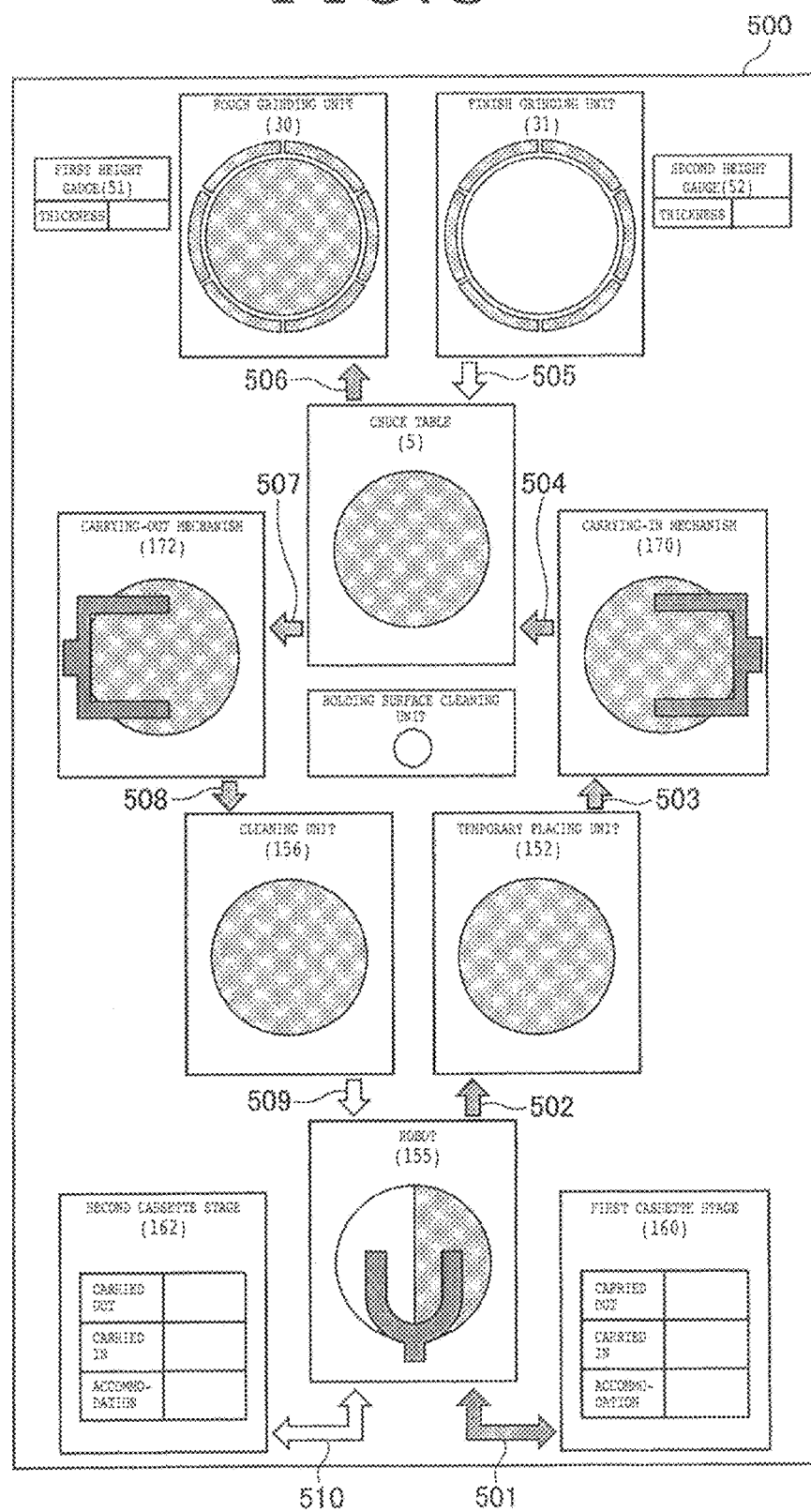
FIG. 3 is a diagram depicting an example of a layout drawing depicting components selected by an operator.

For example, in the example depicted in FIG. 3, the operator hopes to carry out the processes of the following (1-1) to (1-5).
 (1-1) To carry the wafer 100 from the first cassette 161 on the first cassette stage 160 to the temporary placing unit 152.
 (1-2) To carry in the wafer 100 from the temporary placing unit 152 onto the chuck table 5 by the carrying-in mechanism 170.
 (1-3) To subject the wafer 100 held on the chuck table 5 to rough grinding by the rough grinding unit 30.
 (1-4) To carry out the wafer 100 having undergone rough grinding to the cleaning unit 156 by the carrying-out mechanism 172.
 (1-5) To clean the wafer 100 by the cleaning unit 156 and to finish the operation.

In this case, the operator touches the right side of an illustration of the robot 155, and illustrations of the temporary placing unit 152, the carrying-in mechanism 170, the chuck table 5, the rough grinding unit 30, the carrying-out mechanism 172, and the cleaning unit 156 in the layout drawing 500. In response to this, the selection section 72 of the control unit 70 selects the robot 155, the temporary placing unit 152, the carrying-in mechanism 170, the chuck table 5, the rough grinding unit 30, the carrying-out mechanism 172, and the cleaning unit 156.

Note that, in the present embodiment, the illustration of the robot 155 is divided to a right side part and a left side part, and the operator can touch either one or both of them. By touching the right side of the illustration of the robot 155, the operator can select a process of taking out the wafer 100 from the first cassette 161 on the first cassette stage 160 by the robot 155. On the other hand, by touching the left side of the illustration of the robot 155, the operator can select a process of accommodating the wafer 100 into the second cassette 163 on the second cassette stage 162 by the robot 155.

In the layout drawing 500, the control unit 70 applies hatching (for example, hatching in the form of dots) to the illustrations of the robot 155, the temporary placing unit 152, the carrying-in mechanism 170, the chuck table 5, the rough grinding unit 30, the carrying-out mechanism 172, and the cleaning unit 156 which are the selected components, and depicts in white the illustrations of the components which have not been selected. Note that, in this example, the control unit 70 applies hatching to only the right side of the illustration, in regard of the robot 155.

Further, the control unit 70 specifies partial routes for passage of the wafer 100 according to the selected components, applies a hatching (for example, a hatching in the form of slant lines) to arrows indicating the specified partial routes, and depicts in white the other arrows. In this example, the hatching is applied to the arrow 501, arrow 502, arrow 503, arrow 504, arrow 506, arrow 507, and arrow 508.

Then, the control unit 70 carries out the processes of (1-1) to (1-5), according to the operator's starting instruction given by use of the touch panel 60.

Figure 4:
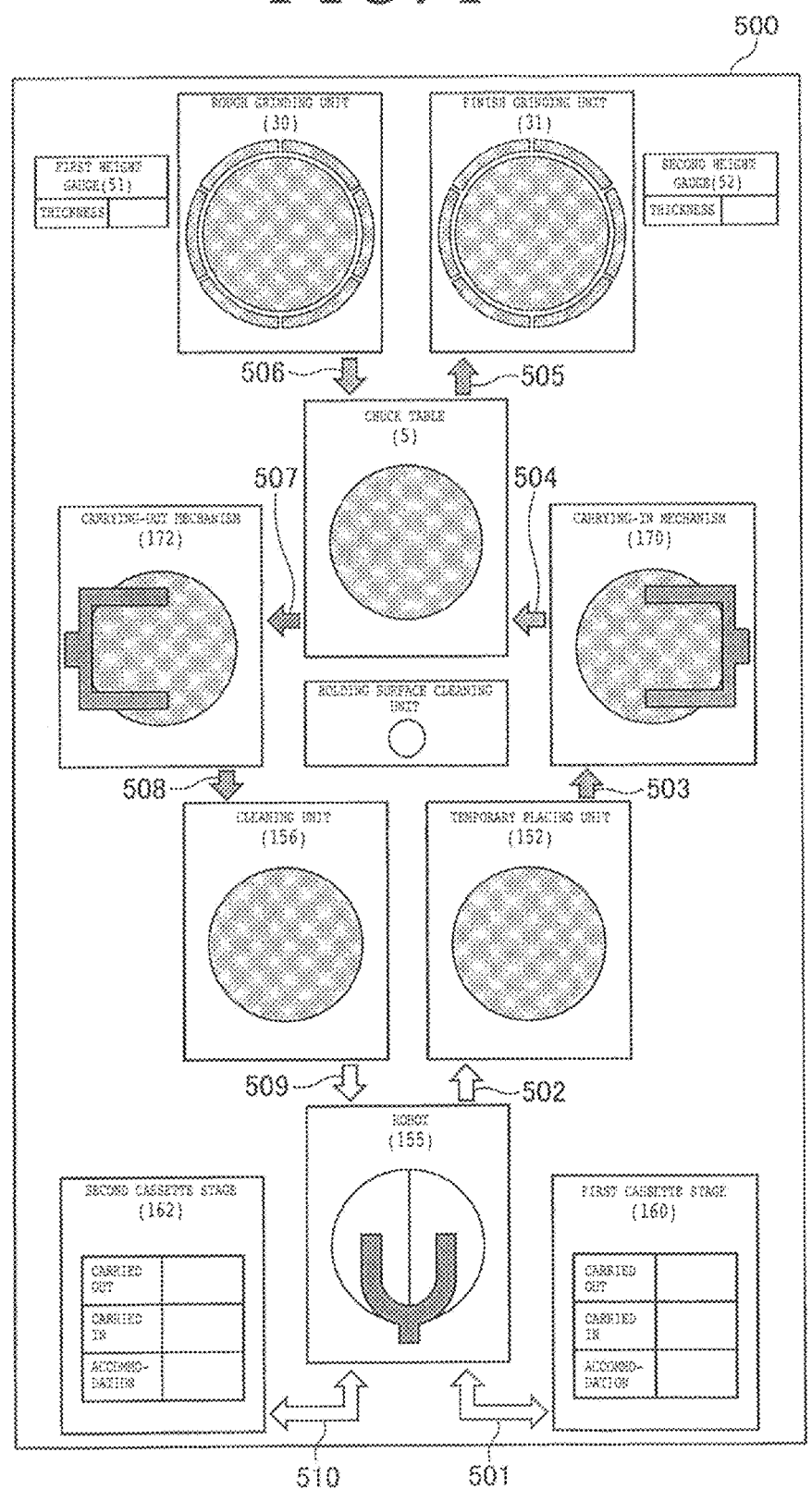
FIG. 4 is a diagram depicting another example of a layout drawing depicting the components selected by the operator.

In addition, in the example depicted in FIG. 4, the operator hopes to carry out the processes of (2-1) to (2-6).
 (2-1) To place the wafer 100 on the temporary placing unit 152 and to start the operation.
 (2-2) To carry in the wafer from the temporary placing unit 152 onto the chuck table 5 by the carrying-in mechanism 170.
 (2-3) To subject the wafer 100 held on the chuck table 5 to rough grinding by the rough grinding unit 30.
 (2-4) To subject the wafer 100 having undergone rough grinding to finish grinding by the finish grinding unit 31.
 (2-5) To carry out the wafer 100 having undergone finish grinding to the cleaning unit 156 by the carrying-out mechanism 172.
 (2-6) To clean the wafer 100 by the cleaning unit 156 and to finish the operation.

In this case, the operator touches the illustrations of the temporary placing unit 152, the carrying-in mechanism 170, the chuck table 5, the rough grinding unit 30, the finish grinding unit 31, the carrying-out mechanism 172, and the cleaning unit 156 in the layout drawing 500. In response to this, the selection section 72 of the control unit 70 selects the temporary placing unit 152, the carrying-in mechanism 170, the chuck table 5, the rough grinding unit 30, the finish grinding unit 31, the carrying-out mechanism 172, and the cleaning unit 156.

Then, the control unit 70 applies the hatching to the illustrations of the temporary placing unit 152, the carrying-in mechanism 170, the chuck table 5, the rough grinding unit 30, the finish grinding unit 31, the carrying-out mechanism 172, and the cleaning unit 156 which are the selected components, and depicts in white the illustrations of the other components which have not been selected.

Further, the control unit 70 specifies the partial routes for passage of the wafer 100 according to the selected components, applies a hatching to the arrows indicating the specified partial routes, and depicts in white the other arrows. In this example, the hatching is applied to the arrow 503, arrow 504, arrow 505, arrow 506, arrow 507, and arrow 508, Then, the operator places the wafer 100 on the temporary placing unit 152 as indicated in (2-1). Thereafter, the operator gives a starting instruction to the control unit 70, by use of the touch panel 60, for example. According to this, the control unit 70 carries out the processes of (2-2) to (2-6).

Figure 5:
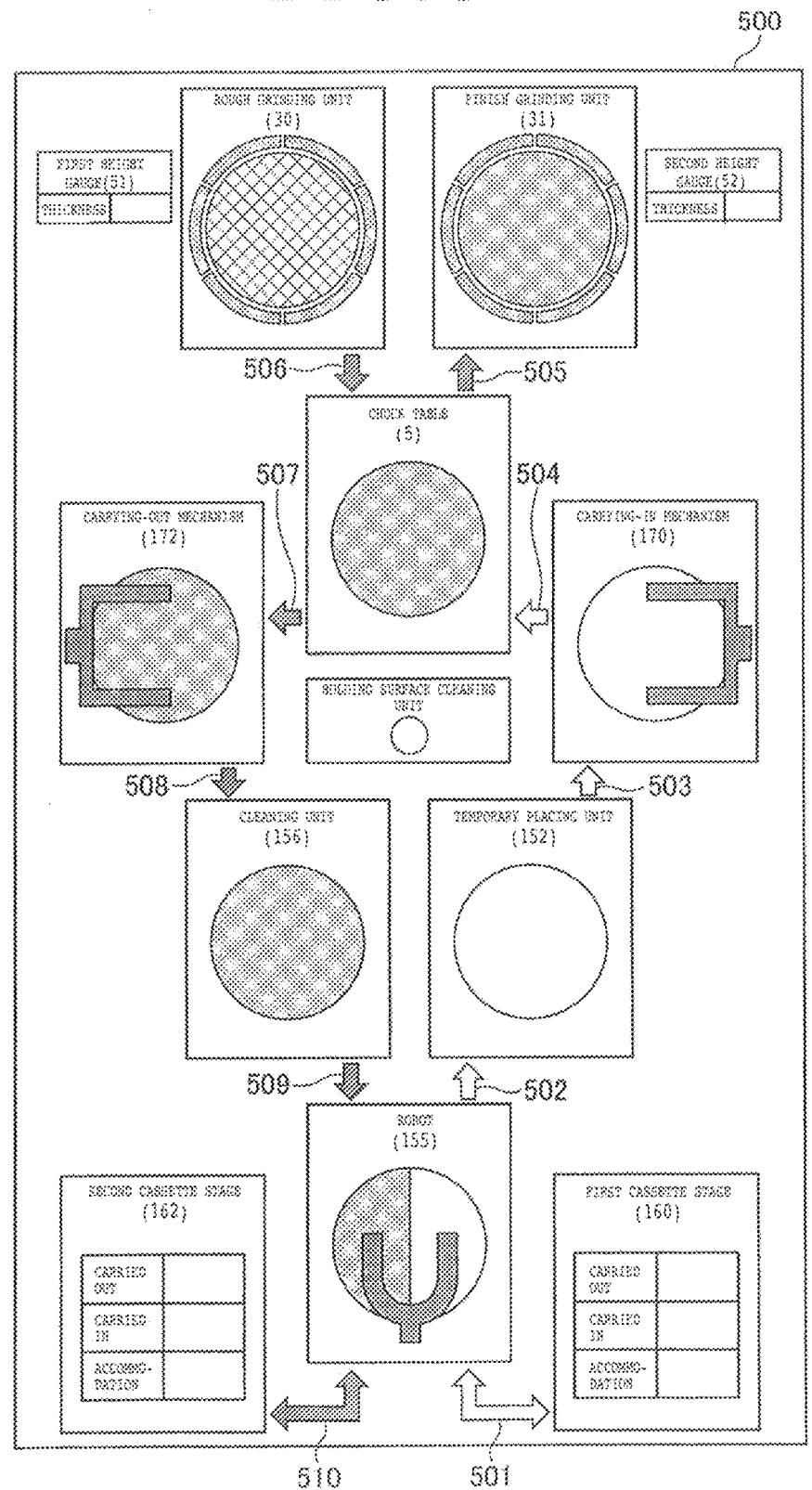
FIG. 5 is a diagram depicting still another example of a layout drawing depicting the components selected by the operator.

Further, in the example depicted in FIG. 5, the operator hopes to carry out the processes of (3-1) to (3-7).

(3-1) To hold the wafer 100 on the chuck table 5 and to start the operation.

(3-2) To subject the wafer 100 held on the chuck table 5 to rough grinding by the rough grinding unit 30.

(3-3) To move the chuck table 5 holding the wafer 100 toward the apparatus front side (the vicinity of the carrying-in mechanism 170), for confirming the back surface 104 which is the work surface of the wafer 100 subjected to rough grinding.

(3-4) To finish the operation by only rough grinding if the operator selects stopping according to the confirmation result. Not to perform cleaning. To subject the wafer 100 having undergone rough grinding to finish grinding by the finish grinding unit 31 if the operator selects continuation.

(3-5) To carry out the wafer 100 having undergone finish grinding to the cleaning unit 156 by the carrying-out mechanism 172.

(3-6) To clean the wafer 100 by the cleaning unit 156.

(3-7) To accommodate the wafer 100 having undergone cleaning into the second cassette 163 on the second cassette stage 162 by the robot 155.

In this case, the operator touches the illustrations of the chuck table 5, the rough grinding unit 30, the finish grinding unit 31, the carrying-out mechanism 172, the cleaning unit 156, and the left side of the robot 155 in the layout drawing 500. In response to this, the selection section 72 of the control unit 70 selects the chuck table 5, the rough grinding unit 30, the finish grinding unit 31 the carrying-out mechanism 172, the cleaning unit 156, and the robot 155.

Then, the control unit 70 applies a hatching to the illustrations of the chuck table 5, the rough grinding unit 30, the finish grinding unit 31, the carrying-out mechanism 172, the cleaning unit 156, and the robot 155 which are the selected components, and depicts in white the illustrations of the other components which have not been selected. Note that, in this example, the control unit 70 applies the hatching to only the left side of the illustration, in regard of the robot 155.

Further, the control unit 70 specifies the partial routes for passage of the wafer 100 according to the selected components, applies a hatching to the arrows indicating the specified partial routes, and depicts in white the other arrows. In this example, the hatching is applied to the arrow 505, arrow 506, arrow 507, arrow 509, and arrow 510.

Then, the operator causes the chuck table 5 to hold the wafer 100 thereon, as indicated in (3-1). Thereafter, the operator gives a starting instruction to the control unit 70, by use of the touch panel 60, for example. According to this, the control unit 70 carries out the processes of (3-2) to (3-7).

Note that, in this example, as indicated in (3-3), the chuck table 5 holding the wafer 100 is moved toward the apparatus front side (the vicinity of the carrying-in mechanism 170), for confirming the back surface 104 which is a work surface of the wafer 100 subjected to rough grinding.

Therefore, the operator touches the illustration of the rough grinding unit 30 in the layout drawing 500, in a predetermined mode for instructing the control unit 70 to carry out this operation. For example, the operator touches the illustration of the rough grinding unit 30 in the layout drawing 500 in a mode different from the touch on the illustrations of the other selected components (for example, depressing for a long time or depressing twice).

In response to this, the control unit 70 applies to the illustration of the rough grinding unit 30 a hatching in a mode (for example, in the form of meshing) different from those for the illustrations of the other selected components, and performs a process of moving the chuck table 5 forward after the rough grinding, as indicated in (3-3). Then, the control unit 70, after the confirmation of the work surface by the operator, finishes the processing operation or performs the processes of (3-4) to (3-7), according to the operator's instruction.

As described above, in the present embodiment, of the processes applied to the wafer 100 in the processing apparatus 1, only the processes of part concerning the components selected by the operator can be selectively carried out. Therefore, the operator can perform only the processes to be confirmed, so that the confirming time can be shortened.

For example, in the example illustrated using FIG. 4, the results of processing in the newly formed processing conditions can be confirmed in a short time. In other words, operations such as carrying-out of the wafer 100 from the first cassette 161 and accommodation of the wafer 100 into the second cassette 163 can be omitted, so that the time for confirming the results of processing can be shortened.

In addition, for example, the operator, by placing the wafer 100 on the temporary placing unit 152, touching the illustrations of the temporary placing unit 152, the carrying-in mechanism 170, and the chuck table 5 in the layout drawing 500 and giving a starting instruction to the control unit 70, can confirm only the carrying-in operation of carrying the wafer 100 onto the chuck table 5 in a short time.

Note that, in the present embodiment, the operator touches the illustrations of at least two components in the layout drawing 500 depicted on the touch panel 60, whereby the selection section 72 of the control unit 70 selects at least two components corresponding to the touched illustrations. In this instance, a setting may be made that the component which is "unused" in the apparatus state display column 600 indicating the preset state (apparatus state) of the processing apparatus 1 depicted in FIG. 2 cannot be selected.

Note that it is favorable that the at least two selected components are continuous in a preset route.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A processing apparatus for processing a workpiece, the processing apparatus comprising: a plurality of components comprising: a holding table that holds the workpiece; a processing unit that processes the workpiece by use of a processing tool; a cassette stage on which to place a shelf-type cassette for accommodating a plurality of workpieces; a robot that takes out the workpiece from the cassette or accommodates the workpiece into the cassette; a temporary placing unit for temporarily placing the workpiece taken out of the cassette; a carrying-in mechanism that carries the workpiece temporarily placed on the temporary placing unit onto the holding table; a cleaning unit that cleans the workpiece; a carrying-out mechanism that carries the workpiece held by the holding table to the cleaning unit; a touch panel having a layout drawing of the plurality of components including the holding table, the processing unit, the robot, the temporary placing unit, the carrying-in mechanism, the cleaning unit, and the carrying-out mechanism, the touch panel enabling a user to select two or more of the plurality of components in the layout drawing prior to processing of the workpiece; and a control unit that automatically moves the workpiece along a route that corresponds to the two or more of the plurality of components selected in the layout drawing on the touch panel, the two or more of the plurality of components selected forming the route for passage of the workpiece at a time of processing the workpiece by use of the two or more of the plurality of components selected.

2. The processing apparatus according to claim 1, wherein the control unit applies hatching to illustrations of the two or more of the plurality of components selected in the layout drawing displayed on the touch panel.

3. The processing apparatus according to claim 1, wherein the control unit applies hatching to arrows between illustrations of the two or more of the plurality of components in the layout drawing to indicate the route of the workpiece.

4. The processing apparatus according to claim 1, wherein the control unit selectively carries out only processes concerning the two or more of the plurality of components selected.

5. The processing apparatus according to claim 1, wherein the control unit includes a selection section, and wherein the selection section selects the two or more of the plurality of components that correspond to the two or more of the plurality of components selected in the layout drawing.

* * * * *